United States Patent
Lee et al.

(10) Patent No.: US 8,932,964 B2
(45) Date of Patent: Jan. 13, 2015

(54) METHOD OF FORMING A DIELECTRIC LAYER HAVING AN ONO STRUCTURE USING AN IN-SITU PROCESS

(75) Inventors: Woo-Jin Lee, Hwaseong-si (KR);
Ji-Soon Park, Suwon-si (KR);
Jong-Myeong Lee, Seongnam-si (KR);
Hyun-Bae Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 158 days.

(21) Appl. No.: 13/444,054

(22) Filed: Apr. 11, 2012

(65) Prior Publication Data

US 2013/0005154 A1     Jan. 3, 2013

(30) Foreign Application Priority Data

Jun. 29, 2011  (KR) .................. 10-2011-0063973

(51) Int. Cl.

| | |
|---|---|
| H01L 21/31 | (2006.01) |
| H01L 21/02 | (2006.01) |
| H01L 21/28 | (2006.01) |
| H01L 29/51 | (2006.01) |
| H01L 29/66 | (2006.01) |
| H01L 29/788 | (2006.01) |

(52) U.S. Cl.
CPC .... *H01L 21/02164* (2013.01); *H01L 21/28202* (2013.01); *H01L 21/0217* (2013.01); *H01L 21/022* (2013.01); *H01L 21/02219* (2013.01); *H01L 21/02274* (2013.01); *H01L 21/0228* (2013.01); *H01L 21/0234* (2013.01); *H01L 21/02359* (2013.01); *H01L 29/513* (2013.01); *H01L 29/66825* (2013.01); *H01L 29/7881* (2013.01)
USPC .......................................... 438/775; 438/776

(58) Field of Classification Search
USPC ....................................................... 438/216
See application file for complete search history.

(56) References Cited

U.S. PATENT DOCUMENTS

| | | | |
|---|---|---|---|
| 2004/0082171 A1* | 4/2004 | Shin et al. ...................... | 438/689 |
| 2004/0121542 A1* | 6/2004 | Chang ........................... | 438/261 |
| 2006/0091559 A1* | 5/2006 | Nguyen et al. ................ | 257/775 |
| 2010/0124621 A1* | 5/2010 | Kobayashi et al. ........... | 427/579 |

FOREIGN PATENT DOCUMENTS

| | | | |
|---|---|---|---|
| JP | 2007-073811 A | | 3/2007 |
| JP | 2007073811 A | * | 3/2007 |
| KR | 10-2003-0087351 A | | 11/2003 |
| KR | 10-2005-0068861 A | | 7/2005 |
| KR | 10-2008-0012056 A | | 2/2008 |

* cited by examiner

*Primary Examiner* — Ajay K Arora
(74) *Attorney, Agent, or Firm* — Lee & Morse, P.C.

(57) ABSTRACT

A method of forming a dielectric layer, the method including sequentially forming a first oxide layer, a nitride layer, and a second oxide layer on a substrate by performing a plasma-enhanced atomic layer deposition process, wherein a first nitrogen plasma treatment is performed after forming the first oxide layer.

16 Claims, 11 Drawing Sheets

METHOD OF FORMING A DIELECTRIC LAYER HAVING AN ONO STRUCTURE USING AN IN-SITU PROCESS

CROSS-REFERENCE TO RELATED APPLICATION

This application claims priority from Korean Patent Application No. 10-2011-0063973 filed on Jun. 29, 2011 in the Korean Intellectual Property Office, and all the benefits accruing therefrom under 35 U.S.C. 119, the contents of which in its entirety are herein incorporated by reference.

BACKGROUND

1. Field

Embodiments relate to a method of forming a dielectric layer having an oxide/nitride/oxide (ONO) structure using an in-situ process.

2. Description of the Related Art

In a flash memory device, a dielectric layer having an ONO structure may be used to separate a floating gate electrode from a control gate electrode. For example, the ONO dielectric layer may be formed by a three-step process of sequentially depositing a silicon oxide layer, a silicon nitride layer, and a silicon oxide layer on a substrate.

The silicon oxide layer and the silicon nitride layer (at the ONO dielectric layer) may be formed at different temperatures in different reactors. For example, the silicon oxide layer and the silicon nitride layer may be formed at a temperature of about 700° C. or higher.

SUMMARY

Embodiments are directed to a method of forming a dielectric layer having an oxide/nitride/oxide (ONO) structure using an in-situ process The embodiments may be realized by providing a method of forming a dielectric layer, the method including sequentially forming a first oxide layer, a nitride layer, and a second oxide layer on a substrate by performing a plasma-enhanced atomic layer deposition process, wherein a first nitrogen plasma treatment is performed after forming the first oxide layer.

Forming the first oxide layer, the nitride layer, and the second oxide layer and performing the first nitrogen plasma treatment may be performed using an in-situ process.

During forming the first oxide layer, the nitride layer, and the second oxide layer and performing the first nitrogen plasma treatment, the substrate may be placed on a susceptor in a chamber and the susceptor may be maintained at a constant temperature.

Performing the first nitrogen plasma treatment may include performing a nitrogen plasma treatment on a surface of the first oxide layer using a gas containing nitrogen and helium.

The method may further include performing a second nitrogen plasma treatment on a surface of the nitride layer, after forming the nitride layer.

Forming the first and second oxide layers may include supplying first and second silicon precursors and oxidizing the first and second silicon precursors, respectively, by performing an oxygen plasma treatment, and forming the nitride layer may include supplying a third silicon precursor and nitridating the third silicon precursor by performing a third nitrogen plasma treatment.

The first to third silicon precursors may be the same and the first to third silicon precursors may have Si—N bonds.

A first power applied to the chamber during the first nitrogen plasma treatment may be larger than a second power applied to the chamber during the oxygen plasma treatments and the third nitrogen plasma treatment.

Performing the third nitrogen plasma treatment may include nitridating the third silicon precursor using a gas containing nitrogen and hydrogen.

The embodiments may also be realized by providing a method of forming a dielectric layer, the method including placing a substrate on a susceptor in a chamber; and sequentially forming a first oxide layer, a nitride layer, and a second oxide layer on the substrate using an in-situ process, wherein the susceptor is maintained at a constant temperature during forming the first oxide layer, the nitride layer, and the second oxide layer.

The method may further include performing a first nitrogen plasma treatment on a surface of the first oxide layer, after forming the first oxide layer.

The method may further include performing a second nitrogen plasma treatment on a surface of the nitride layer, after forming the nitride layer.

Forming the first oxide layer, the nitride layer, and the second oxide layer may include performing a plasma enhanced atomic layer deposition process, and a first power applied to the chamber during the first nitrogen plasma treatment and the second nitrogen plasma treatment may be larger than a second power applied to the chamber to form the first oxide layer, the nitride layer, and the second oxide layer.

Forming the first and second oxide layers may include supplying first and second silicon precursors and oxidizing the first and second silicon precursors, respectively, by performing oxygen plasma treatments, and forming the nitride layer may include supplying a third silicon precursor and nitridating the third silicon precursor by performing a third nitrogen plasma treatment.

The first to third silicon precursors may be the same and the first to third silicon precursors may have Si—N bonds.

The embodiments may also be realized by providing a method of forming a dielectric layer using an in-situ process, the method including forming a first oxide layer on a substrate by performing a plasma-enhanced atomic layer deposition process; performing a first nitrogen plasma treatment on the first oxide layer; forming a nitride layer on the first oxide layer by performing a plasma-enhanced atomic layer deposition process; forming a second oxide layer on the nitride layer by performing a plasma-enhanced atomic layer deposition process.

Performing the first nitrogen plasma treatment may include performing a nitrogen plasma treatment on a surface of the first oxide layer using a gas containing nitrogen and helium.

Forming the first oxide layer may include supplying a silicon precursor and oxidizing the silicon precursor by performing an oxygen plasma treatment, forming the nitride layer may include supplying the silicon precursor and nitridating the precursor by performing a third nitrogen plasma treatment, and forming the second oxide layer may include supplying the silicon precursor and oxidizing the silicon precursor by performing an oxygen plasma treatment.

Performing the third nitrogen plasma treatment may include nitridating the precursor using a gas containing nitrogen and hydrogen.

The method may further include performing a first nitrogen plasma treatment on a surface of the first oxide layer, after forming the first oxide layer; and performing a second nitrogen plasma treatment on a surface of the nitride layer, after forming the nitride layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
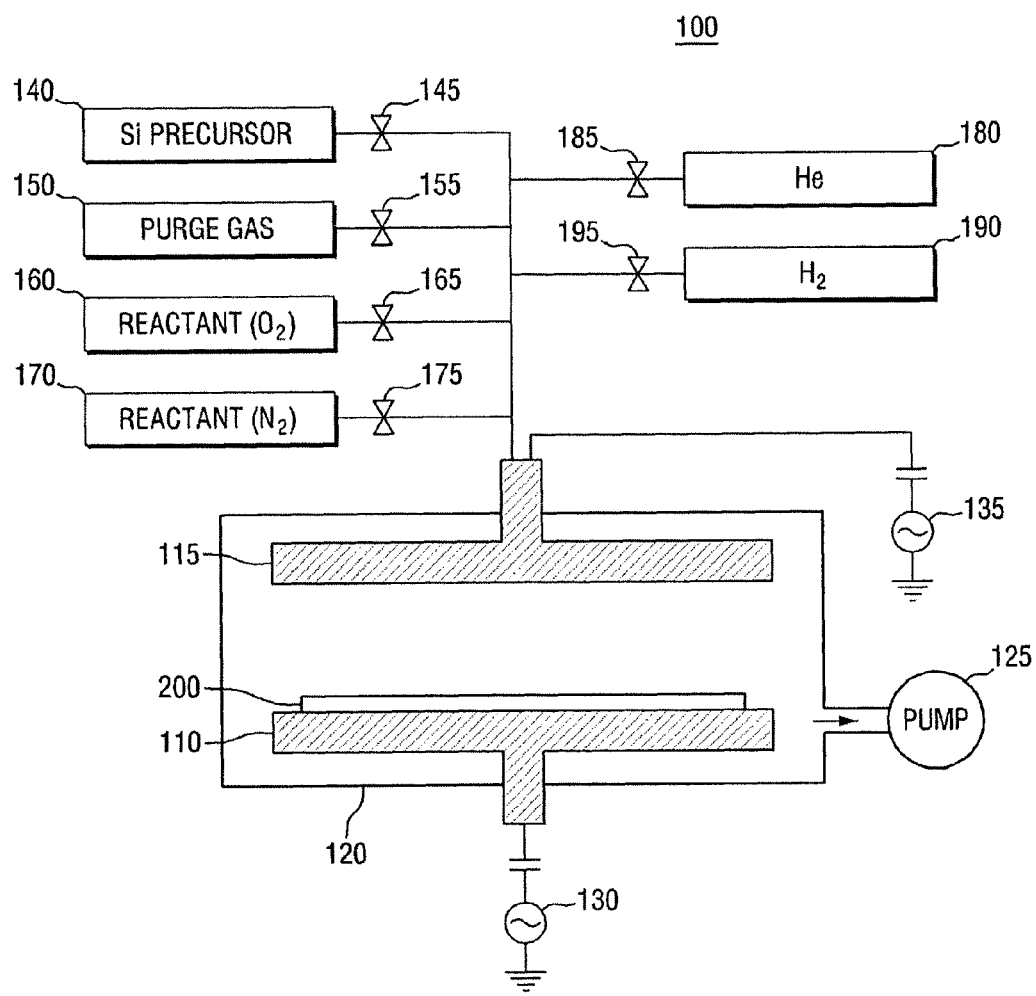
FIG. 1 illustrates a schematic view of plasma deposition equipment to which a method for forming a dielectric layer according to an embodiment is applied.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, plasma deposition equipment to which a method for forming a dielectric layer according to an embodiment is applied will be described with reference to FIG. 1. FIG. 1 illustrates a schematic view of plasma deposition equipment to which a method for forming a dielectric layer according to an embodiment is applied.

Referring to FIG. 1, the plasma deposition equipment 100 may include a chamber 120 having a susceptor 110 and a shower plate 115 facing the susceptor 110. The susceptor 110 may support a substrate 200 while a deposition process is performed. In addition, the susceptor 110 may serve as a heater to maintain the substrate 200 at a constant temperature while performing the deposition process. The susceptor 110 may also serve as a lower electrode.

The shower plate 115 may supply gases used for forming a dielectric layer into the chamber 120. Gases may be supplied from first to sixth sources 140, 150, 160, 170, 180, and 190 to the shower plate 115 to then be injected into the chamber 120. First to sixth valves 145, 155, 165, 175, 185, and 195 may be controlled to determine which gas is to be injected from the first to sixth sources 140, 150, 160, 170, 180, and 190 into the chamber 120.

The plasma deposition equipment 100 may include a bias power unit 130 (that supplies bias power to the susceptor 110) and a source power unit 135 (that supplies source power to the shower plate 115). Plasma reactions of gases supplied from the first to sixth sources 140, 150, 160, 170, 180, and 190 may be induced using the bias power unit 130 and the source power unit 135.

In addition, the plasma deposition equipment 100 may include a pump 125 for maintaining the chamber 120 at a vacuum and exhausting gases remaining in the chamber 120.

Figure 2:
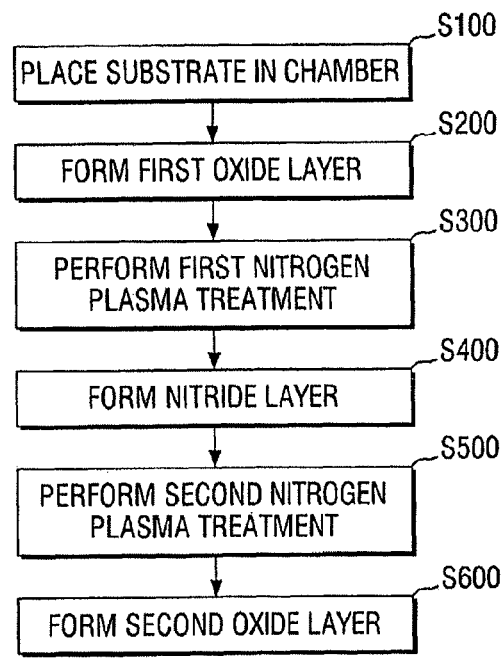
FIG. 2 illustrates a flowchart showing a method for forming a dielectric layer according to an embodiment.
Figure 3:
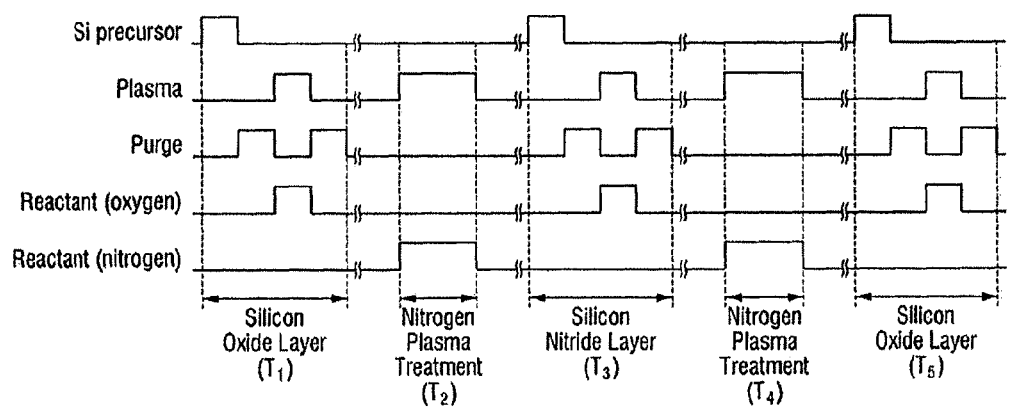
FIG. 3 illustrates a timing diagram showing the method for forming a dielectric layer of FIG. 2.

A method of forming a dielectric layer according to an embodiment will now be described with reference to FIGS. 1 through 13. FIG. 2 illustrates a flowchart showing the method for forming a dielectric layer according to an embodiment. FIG. 3 illustrates a timing diagram showing the method for forming a dielectric layer of FIG. 2. FIGS. 4 through 13 illustrate cross-sectional views showing stages in the method of forming a dielectric layer of FIG. 2.

Referring to FIGS. 1 and 2, the substrate 200 may be placed in the chamber 120 (S100).

For example, the substrate 200 may be positioned on the susceptor 110 in the chamber 120. As described above, the susceptor 110 may serve as a heater. Thus, the susceptor 110 may be maintained at a constant temperature while performing the ONO dielectric layer formation process. For example, while the ONO dielectric layer formation process is performed, the temperature of the substrate 200 may be constantly maintained by the susceptor 110. In an implementation, the susceptor 110 may be maintained at about 500° C. or less.

Next, referring to FIGS. 1 through 6, a first oxide layer 210 may be formed on the substrate 200 (S200).

Referring to FIG. 3, during a first oxide layer forming period T1, a first silicon precursor 207 may be fed into the chamber 120, purged, oxidized by performing oxygen plasma treatment on the first silicon precursor 207, and purged. Here, the substrate 200 may be maintained at a constant temperature by the susceptor 110 during the first oxide layer forming period T1.

Figure 4:
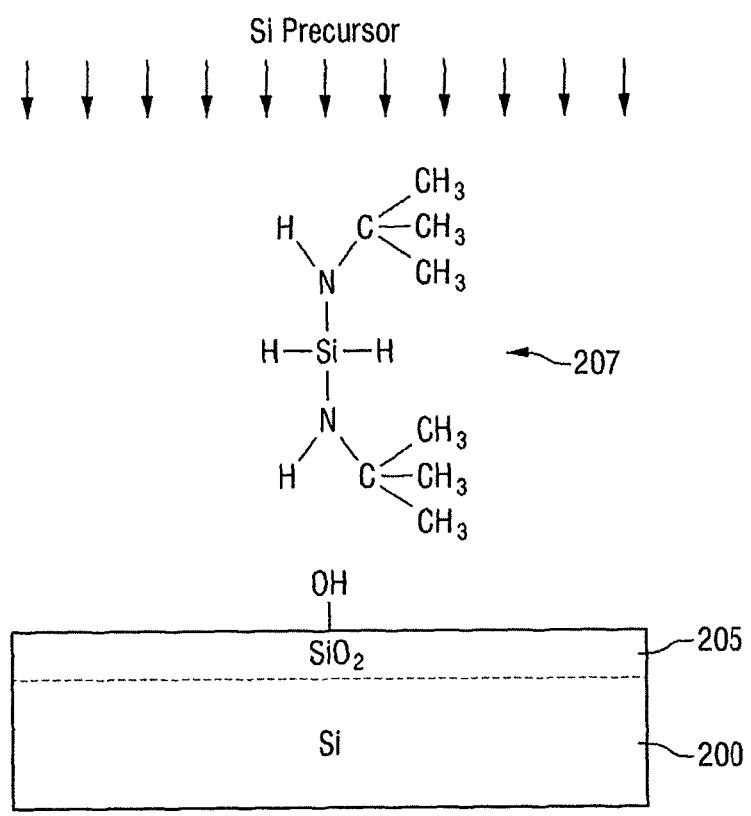
FIGS. 4 through 13 illustrate cross-sectional views of stages in the method of forming a dielectric layer of FIG. 2.
Figure 5:
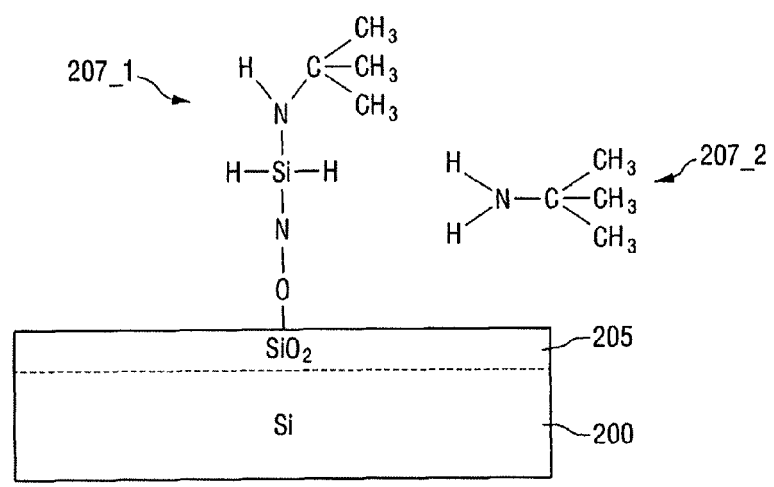

For example, referring to FIGS. 1 and 3, the first valve 145 may be opened to feed the first silicon precursor 207 (of the first source 140) into the chamber 120 through the shower plate 115. Referring to FIG. 4, the first silicon precursor 207 may be fed onto the substrate 200. Referring to FIG. 5, a portion 207_1 of the first silicon precursor 207 may be adsorbed onto the substrate 200.

The substrate 200 may include, e.g., silicon (Si). If the substrate 200 includes silicon (Si), a native oxide layer 205 may be formed on a portion of the substrate 200. For example, the first silicon precursor 207 may include a silane-based material or a material having Si—N bonds. In an implementation, the first silicon precursor 207 may include, e.g., bis(tertiarybutylamino)silane (BTBAS).

Next, referring to FIGS. 1 and 5, the second valve 155 may be opened to feed a purge gas (of the second source 150) into the chamber 120 through the shower plate 115. A portion 207_2 of the first silicon precursor 207 that is not adsorbed onto the substrate 200 may be purged by the purge gas to then be exhausted outside of the chamber 120 through the pump 125.

Figure 6:
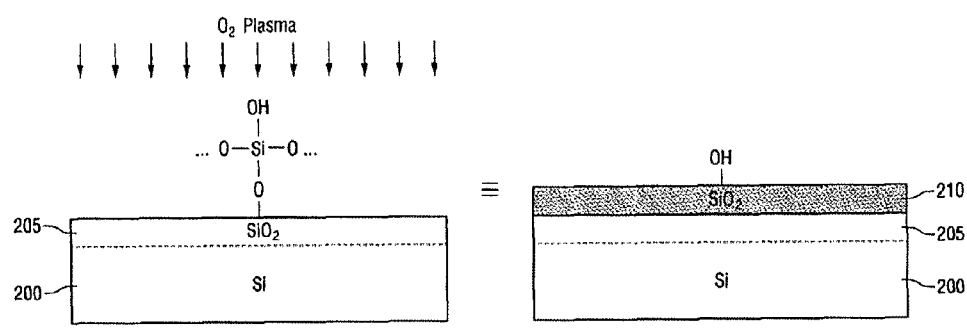

Referring to FIGS. 1 and 6, the third valve 165 may be opened to feed an oxygen gas (of the third source 160) into the chamber 120 through the shower plate 115. In order to activate plasma, a power of about 100 W may be applied between the shower plate 115 and the susceptor 110. Applying the power into the chamber 120 may change the oxygen gas into plasma. Thus, the first silicon precursor portion (207_1 of FIG. 5) may be oxidized by oxygen plasma treatment, and the first oxide layer 210 may be formed on the substrate 200.

Next, referring back to FIG. 1, the second valve 155 may be opened to feed the purge gas (of the second source 150) into the chamber 120 through the shower plate 115. Unreacted gases (not having participated in reactions taking place in the chamber 120) may be purged by the purge gas to then be exhausted outside of the chamber 120 through the pump 125.

Figure 7:
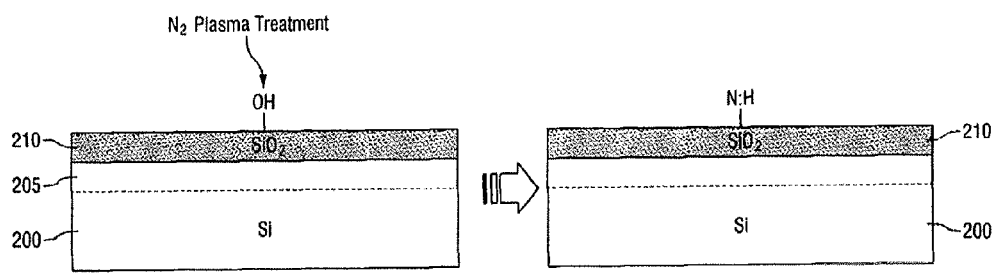

Referring to FIGS. 1, 3, and 7, a surface of the first oxide layer 210 may be subjected to first nitrogen plasma treatment (S300).

Referring to FIGS. 1 and 3, during a nitrogen plasma treatment period T2, the fourth valve 175 may be opened to feed a nitrogen gas (of the fourth source 170) into the chamber 120 through the shower plate 115. In order to activate plasma, a power of about 200 W may be applied between the shower plate 115 and the susceptor 110. Applying the power into the chamber 120 may change the nitrogen gas into plasma. Thus, a surface of the first oxide layer 210 may be subjected to the first nitrogen plasma treatment (S300).

In an implementation, the fifth valve 185 may be opened to feed a helium gas (of the fifth source 180) into the chamber 120 at the same time with the nitrogen gas (of the fourth source 170). The helium gas may facilitate changing of the nitrogen gas into plasma. For example, the helium gas may be supplied during at least a portion of or during the entire nitrogen plasma treatment period T2.

Referring to FIG. 7, hydroxide (—OH) groups on the surface of the first oxide layer 210 may be substituted by amino (NH) groups by the first nitrogen plasma treatment. For example, the first nitrogen plasma treatment may reduce a density of the hydroxide (—OH) groups on the surface of the first oxide layer 210.

The hydroxide (—OH) group may have a weaker bonding force than the amino (NH) group. Thus, the first nitrogen plasma treatment may increase a bonding force between the first oxide layer 210 and a nitride layer (220 of FIG. 11) by substituting the hydroxide (—OH) groups on the surface of the first oxide layer 210 with amino (—NH) groups. In addition, it is possible to suppress generation of particles caused by an unstable interface state between the first oxide layer 210 and the nitride layer 220.

As described above, during the formation process of the first oxide layer 210, a power of about 100 W may be applied to the chamber 120. By contrast, during the first nitrogen plasma treatment process, a power of about 200 W may be applied to the chamber 120. In order to substitute hydroxide (—OH) groups with amino (NH) groups, relatively high energy plasma may be required. Thus, more power may be applied to the chamber 120 during the first nitrogen plasma treatment period T2.

Next, referring to FIGS. 1, 2, and 8 through 12, the nitride layer 220 may be formed on the first oxide layer 210 (S400).

Referring to FIG. 3, during a nitride layer forming period T3, a second silicon precursor 217 may be fed into the chamber 120, purged, oxidized by performing nitrogen plasma treatment on the second silicon precursor 217, and purged. Here, the substrate 200 may be maintained at a constant temperature by the susceptor 110 during the nitride layer forming period T3.

Figure 9:
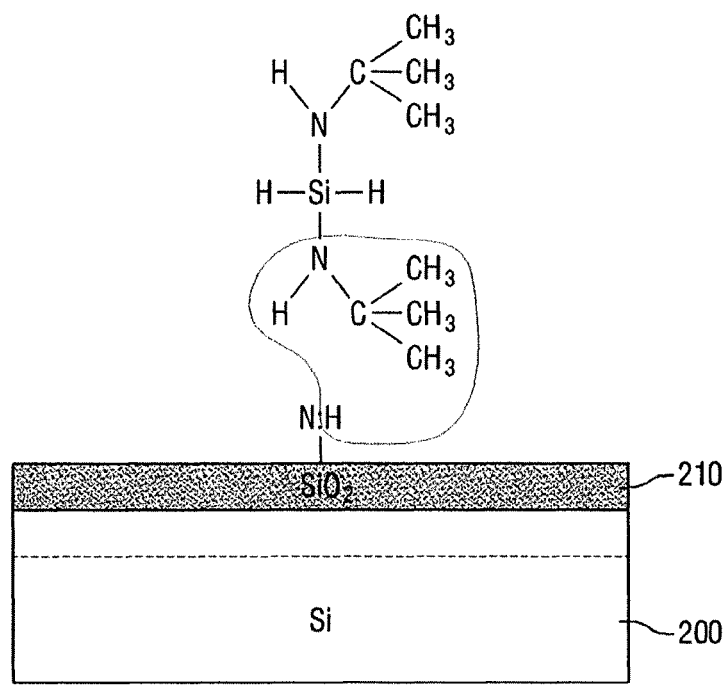
Figure 10:
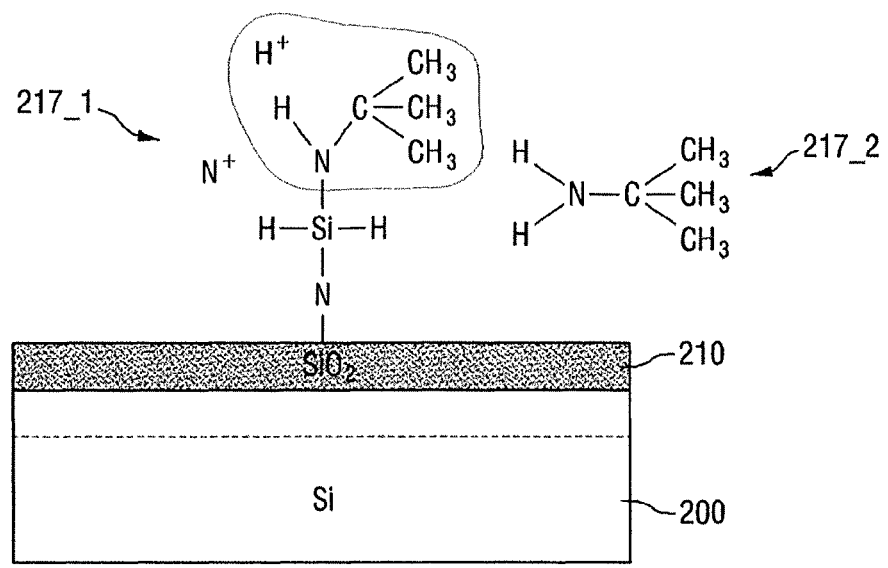

Referring to FIGS. 1 and 3, the first valve 145 may be opened to feed the second silicon precursor 217 (of the first source 140) into the chamber 120 through the shower plate 115. For example, referring to FIG. 8, the second silicon precursor 217 may be fed onto the first oxide layer 210. Referring to FIGS. 9 and 10, a portion 217_1 of the second silicon precursor 217 may be adsorbed onto the first oxide layer 210.

The second silicon precursor 217 may be the same with the first silicon precursor (207 of FIG. 4). For example, in the method for forming a dielectric layer according to the present embodiment, the same silicon precursor may be supplied when the oxide layer and the nitride layer are formed, while different reactant gases may be fed into the chamber 120.

Next, referring to FIGS. 1 and 10, the second valve 155 may be opened to feed the purge gas (of the second source 150) into the chamber 120 through the shower plate 115. A portion 217_2 of the second silicon precursor 217 (that is not adsorbed onto the substrate 200) may be purged by the purge gas to then be exhausted outside of the chamber 120 through the pump 125.

Figure 11:
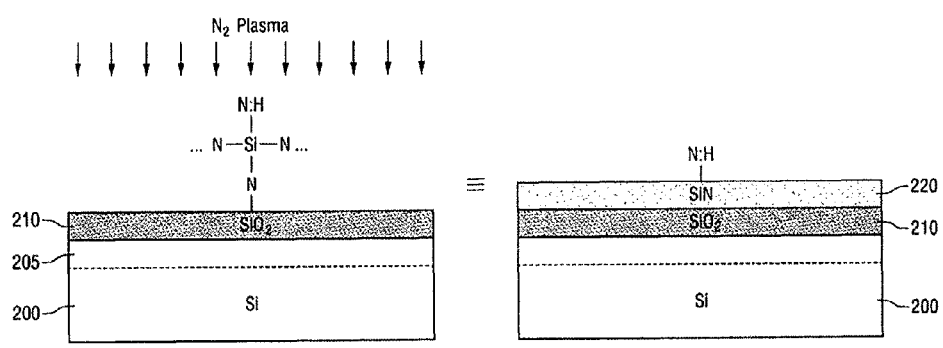

Referring to FIGS. 1 and 11, the fourth valve 175 may be opened to feed the nitrogen gas (of the fourth source 170) into the chamber 120 through the shower plate 115. In order to activate plasma, a power of about 100 W may be applied between the shower plate 115 and the susceptor 110. Applying the power into the chamber 120 may change the nitrogen gas into plasma. Thus, the second silicon precursor portion (217_1 of FIG. 10) may be nitridated by nitrogen plasma treatment, and the nitride layer 220 may be formed on the first oxide layer 210.

In an implementation, the sixth valve 195 may be opened to feed a hydrogen gas (of the sixth source 190) into the chamber 120 at the same time with the nitrogen gas (of the fourth source 170). Forming the nitride layer 220 using the nitrogen gas and the hydrogen gas may increase a density of the nitride layer 220, thereby improving an insulating property of the nitride layer 220.

Next, referring back to FIG. 1, the second valve 155 may be opened to feed the purge gas (of the second source 150) into the chamber 120 through the shower plate 115. Unreacted gases (not having participated in reactions taking place in the chamber 120) may be purged by the purge gas to then be exhausted outside of the chamber 120 through the pump 125.

Figure 12:
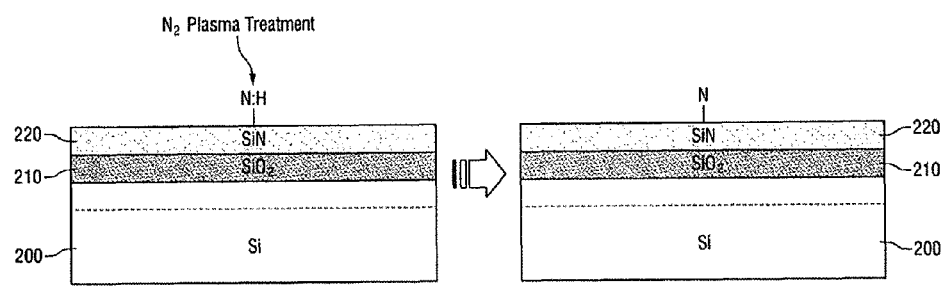

Referring to FIGS. 1, 3 and 12, a surface of the nitride layer 220 may be subjected to a second nitrogen plasma treatment (S500).

Referring to FIGS. 1 and 3, during a nitrogen plasma treatment period T4, the fourth valve 175 may be opened to feed the nitrogen gas (of the fourth source 170) into the chamber 120 through the shower plate 115. In order to activate plasma, a power of about 200 W may be applied between the shower plate 115 and the susceptor 110. Applying the power into the chamber 120 may change the nitrogen gas into plasma. Thus, a surface of the nitride layer 220 may be subjected to second nitrogen plasma treatment.

In an implementation, the fifth valve 185 may be opened to feed the helium gas (of the fifth source 180) into the chamber 120 at the same time with the nitrogen gas (of the fourth source 170). The helium gas may facilitate changing of the nitrogen gas into plasma.

Referring to FIG. 12, hydrogen (H) contained in the amino (—NH) groups on the surface of the nitride layer 220 may be removed by the second nitrogen plasma treatment. For example, the second nitrogen plasma treatment may reduce a density of the amino (NH) groups on the surface of the nitride layer 220, thereby reducing a density of hydrogen (H) on the surface of the nitride layer 220.

For example, an insulating property of the nitride layer 220 may be improved by performing the second nitrogen plasma treatment on the nitride layer 220 to reduce the hydrogen (H) density of the surface of the nitride layer 220. Thus, the dielectric layer may be formed even at a low temperature, e.g., when the susceptor 110 maintains the temperature at about 500° C. or less.

As described above, during forming the first oxide layer 210 and the nitride layer 220, a power of about 100 W may be applied to the chamber 120. In contrast, during the first nitrogen plasma treatment process, a power of about 200 W may be applied to the chamber 120. In order to remove hydrogen (H) from amino (—NH) groups, relatively high energy plasma may be required. Thus, more power may be applied to the chamber 120 during the second nitrogen plasma treatment period T4.

Figure 13:
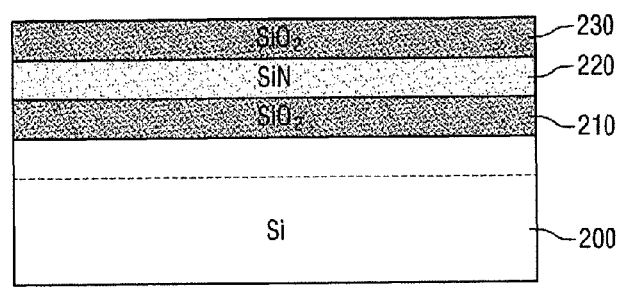

Next, referring to FIGS. 1, 3, and 13, a second oxide layer 230 may be formed on the nitride layer 220 (S600).

Forming the second oxide layer 230 may be substantially the same as forming the first oxide layer 210, except that the oxide layer is formed on the nitride layer 220, and thus the following description will be briefly given.

Figure 8:
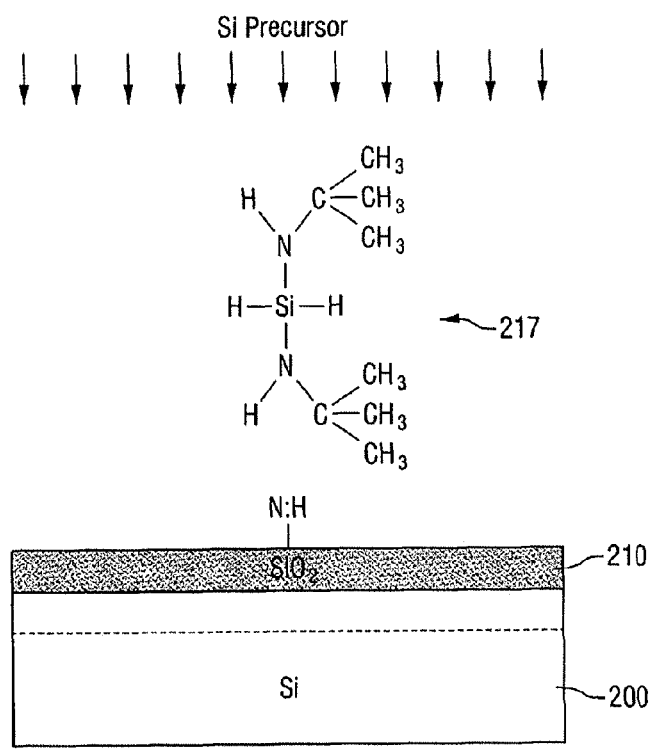

A third silicon precursor may be the same as the first or second silicon precursor (207 of FIG. 4 or 217 of FIG. 8). For example, in the method for forming a dielectric layer according to the present embodiment, the same silicon precursor may be supplied when the oxide layer and the nitride layer are formed.

Thus, referring to FIG. 13, according to the present embodiment, the first oxide layer 210, the nitride layer 220, and the second oxide layer 230 may be sequentially formed on the substrate 200, thereby forming the dielectric layer having an oxide/nitride/oxide (ONO) structure.

For example, forming the first oxide layer 210, the nitride layer 220, and the second oxide layer 230 and performing first and second nitrogen plasma treatments may be performed using an in-situ process. For example, the substrate 200 may be maintained at a constant temperature by the susceptor 110, and the in-situ process may be performed using the same silicon precursor. Thus, the dielectric layer forming process may be streamlined and simplified, thereby increasing manufacturing efficiency of the dielectric layer. In addition, multiple layers may be formed on a substrate 200 disposed in a single chamber. Thus, it may not be necessary to transfer the substrate 200 to another chamber, and contamination of the dielectric layer (which may be caused while moving the substrate 200), may be avoided, thereby increasing the reliability of the dielectric layer.

In the method for forming a dielectric layer according to the present embodiment, plasma-enhanced atomic layer deposition (PEALD) may be used. Therefore, the dielectric layer formed by the method for forming a dielectric layer according to the present embodiment may have high step coverage. Further, the method for forming a dielectric layer according to the present embodiment may be performed using an in-situ process. Thus, a nitride layer may be easily formed and a thickness of the nitride layer may be easily adjusted. For example, an oxide layer and a nitride layer may be formed using the same silicon precursor. Thus, it may be easy to determine which of the oxide layer and the nitride layer is to be formed by controlling reactant gases supplied to a chamber. In addition, if it is desired that the oxide layer be thickly formed, an oxide layer forming process may be repeatedly performed several times until the oxide layer has the desired thickness, followed by performing the nitride layer forming process.

Figure 14:
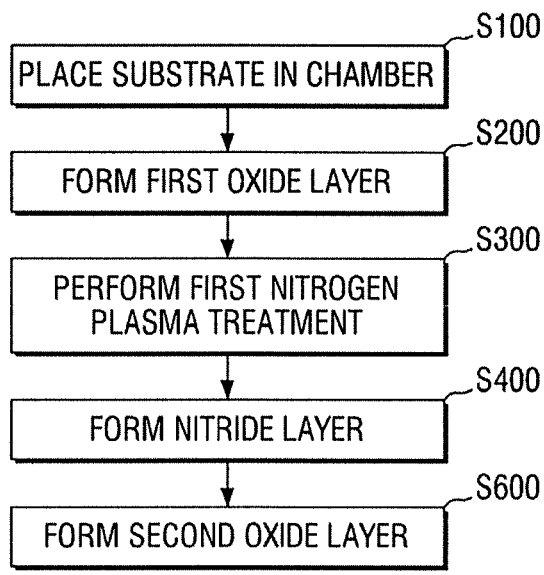
FIG. 14 illustrates a flowchart showing a method for forming a dielectric layer according to another embodiment.

FIG. 14 illustrates a flowchart showing a method of forming a dielectric layer according to another embodiment. The following description will focus on differences from the method according to the previous embodiment.

Referring to FIG. 14, the method for forming a dielectric layer according to the present embodiment is different from the previous embodiment in that a surface of a nitride layer (220 of FIG. 13) may not be subjected to second nitrogen plasma treatment.

Figure 15:
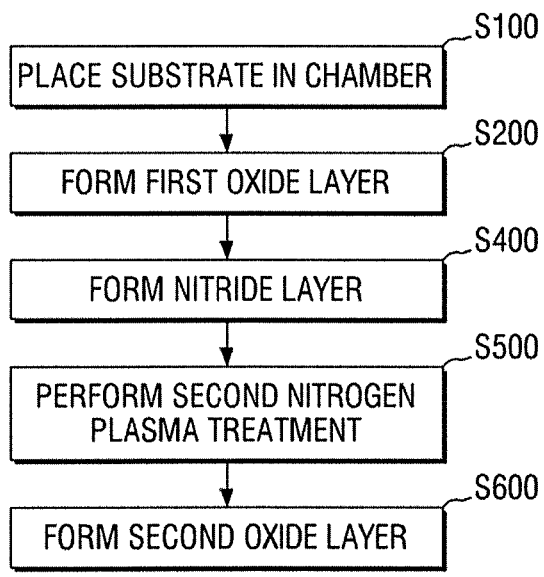
FIG. 15 illustrates a flowchart showing a method for forming a dielectric layer according to yet another embodiment.

FIG. 15 illustrates a flowchart showing a method of forming a dielectric layer according to yet another embodiment. The method for forming a dielectric layer according to the present embodiment will be described with reference to FIG. 15. However, the following description will focus on differences from the method according to the previous embodiments.

Referring to FIG. 15, the method of forming a dielectric layer according to the present is different from the previous embodiments in that a surface of a first oxide layer (210 of FIG. 13) may not be subjected to first nitrogen plasma treatment.

Figure 16:
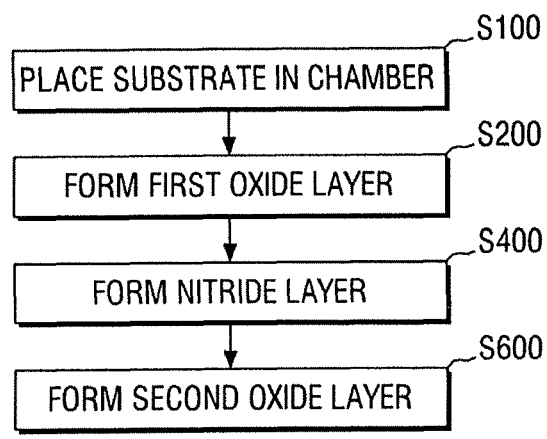
FIG. 16 illustrates a flowchart showing a method for forming a dielectric layer according to still another embodiment.

FIG. 16 illustrates a flowchart showing a method of forming a dielectric layer according to still another embodiment. The method of forming a dielectric layer according to the present will be described with reference to FIG. 16. However, the following description will focus on differences from the method according to the previous embodiments.

Referring to FIG. 16, the method of forming a dielectric layer according to the present embodiment is different from the method of forming a dielectric layer according to the previous embodiments in that a surface of a first oxide layer (210 of FIG. 13) may not be subjected to first nitrogen plasma treatment and a surface of a nitride layer (220 of FIG. 13) may not be subjected to second nitrogen plasma treatment.

Figure 17:
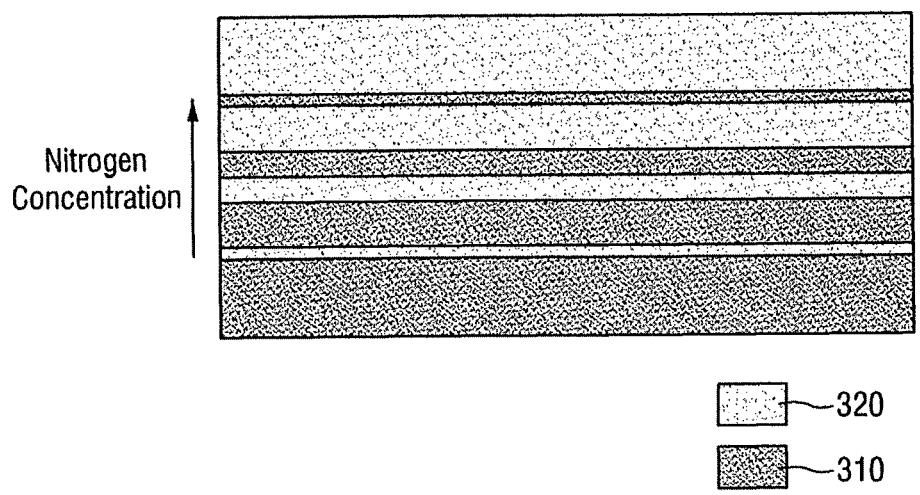
FIG. 17 illustrates a cross-sectional view of an intermediate structure in a method of forming a dielectric layer according to still another embodiment.

FIG. 17 illustrates a cross-sectional view of an intermediate structure for explaining a method for forming a dielectric layer according to still another embodiment. The method for forming a dielectric layer according to the present embodiment will be described with reference to FIG. 17.

Referring to FIG. 17, a dielectric layer having a nitrogen concentration increasing upwardly and an oxygen concentration increasing downwardly may be formed. An oxide layer 310 and a nitride layer 320 may be formed such that a thickness of the nitride layer 320 gradually increases upwardly (with respect to a plane of FIG. 17), while a thickness of the oxide layer 310 gradually increases downwardly (with respect to a plane of FIG. 17).

Equipment to which a method of forming a dielectric layer according to an embodiment is applied will now be described with reference to FIGS. 18 through 21. FIGS. 18 through 21 illustrate perspective and cross-sectional views of devices to which a method for forming a dielectric layer according to an embodiment is applied.

Figure 18:
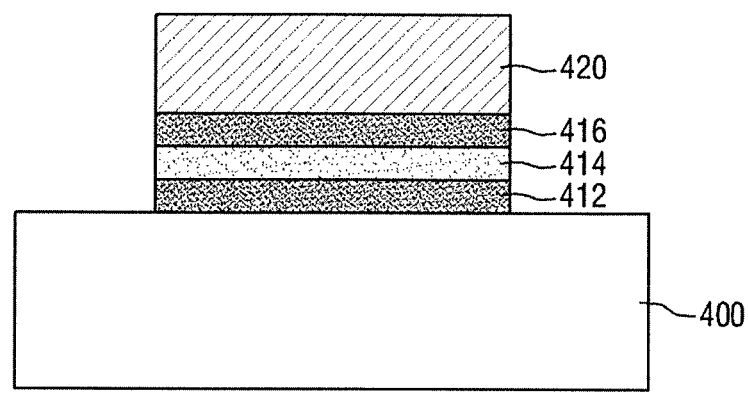
FIGS. 18 through 21 illustrate perspective and cross-sectional views of devices to which a method for forming a dielectric layer according to embodiments is applied.
Figure 19:
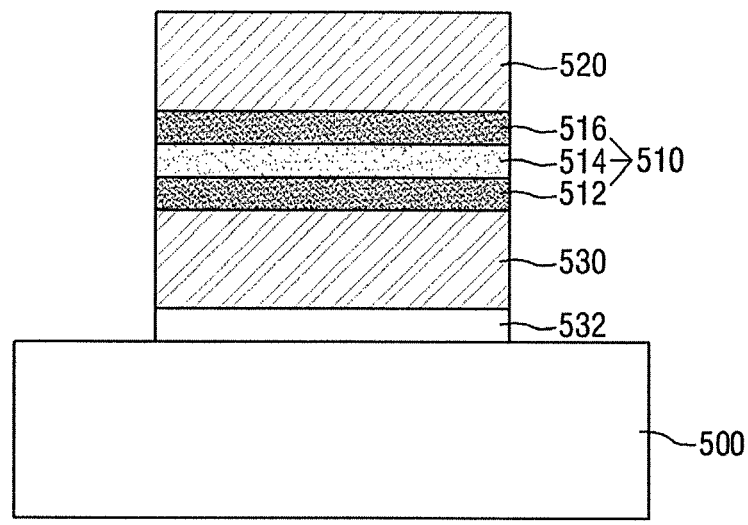

First, referring to FIGS. 18 and 19, the method of forming a dielectric layer according to an embodiment may be used in forming a flash memory device.

Referring to FIG. 18, a first oxide layer 412, a nitride layer 414, a second oxide layer 416, and a control gate electrode 420 may be sequentially formed on a substrate 400. For example, the first oxide layer 412 may be a tunnel oxide layer, and the nitride layer 414 may be a charge trap layer.

Referring to FIG. 19, a tunnel oxide layer 532, a floating gate electrode 530, an ONO dielectric layer 510, and a control gate electrode 520 may be sequentially formed on a substrate 500. The floating gate electrode 530 and the control gate electrode 520 may be separated from each other by the ONO dielectric layer 510. The ONO dielectric layer 510 may be configured such that a first oxide layer 512, a nitride layer 514, and a second oxide layer 516 are sequentially formed.

Figure 20:
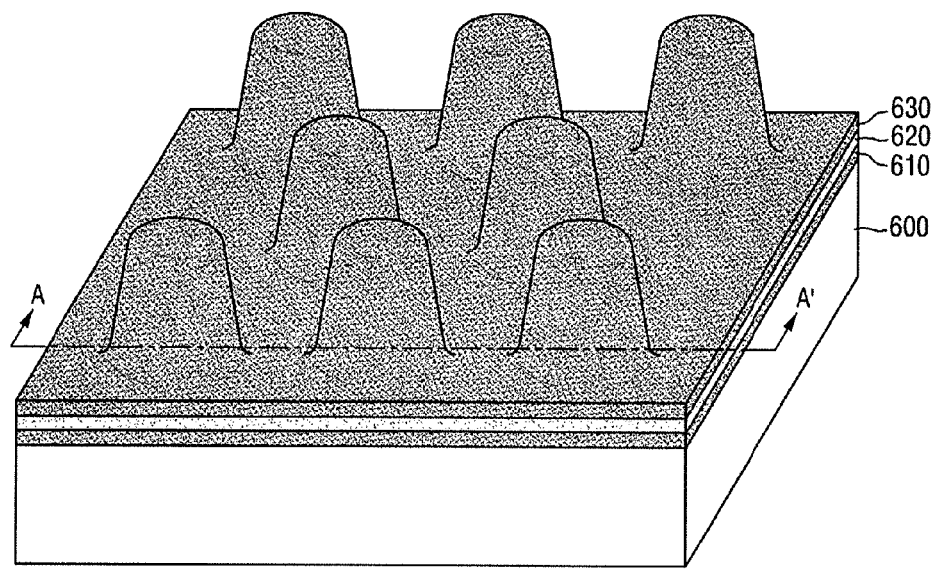
Figure 21:
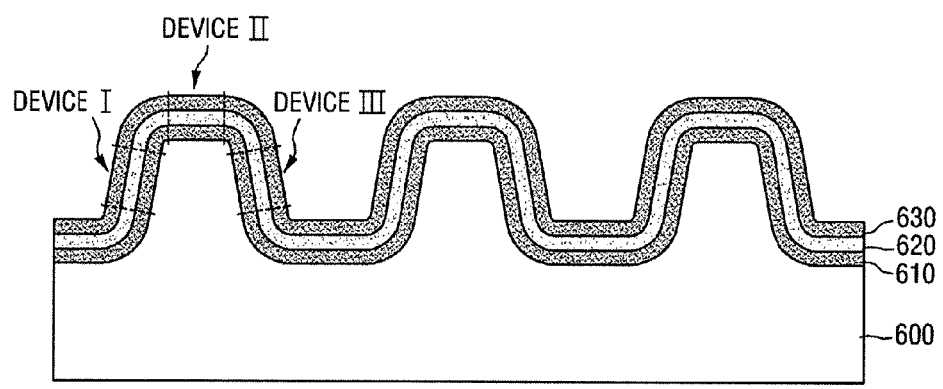

Referring to FIGS. 20 and 21, the method of forming a dielectric layer according to an embodiment may be used in forming other types of memory devices.

Referring to FIG. 20, a substrate 600 may include a plurality of protrusions, and a first oxide layer 610, a nitride layer 620, and a second oxide layer 630 may be sequentially formed on the substrate 600. The dielectric layer formed by the method of forming a dielectric layer according to an embodiment may have high step coverage. Thus, the dielectric layer may be stably deposited on the substrate 600 having the plurality of protrusions.

FIG. 21 illustrates a cross-sectional view of the device of FIG. 20, taken along the line A-A'. Referring to FIG. 21, not only an ONO dielectric layer (formed on top surfaces of protrusions of the substrate 600), but also an ONO dielectric layer (formed on surfaces of the protrusions) may be used in discrete memory devices.

By way of summation and review, the ONO dielectric layer may be formed in multiple reactors. In this case, it may be necessary for the dielectric layer to be moved between different reactors, thereby reducing manufacturing efficiency of the dielectric layer and increasing the likelihood contamination of the dielectric layer while moving between reactors. The contaminated dielectric layer may cause an unstable interface state, thereby lowering the reliability of the dielectric layer.

For example, the ONO dielectric layer may be formed by a three-step process of sequentially depositing a silicon oxide layer, a silicon nitride layer, and a silicon oxide layer on a substrate. The silicon oxide layer and the silicon nitride layer included in the ONO dielectric layer may be formed at different temperatures in different reactors. In detail, the silicon oxide layer and the silicon nitride layer may be formed at a temperature of 700° C. or higher.

The embodiments provide a process for preparation of a semiconductor device including an ONO structure, including forming the ONO structure by providing a semiconductor substrate having a silicon surface; forming a first oxide layer on the silicon surface; depositing a silicon nitride layer on the first oxide layer, wherein the silicon nitride layer is formed by in-situ plasma generated nitration of surface of the silicon oxide layer; and forming a top oxide layer on the silicon nitride layer within same chamber. The embodiments provide a method of forming a dielectric layer, which may increase manufacturing efficiency of the dielectric layer and may protect and/or prevent the dielectric layer from being contaminated by forming an oxide/nitride/oxide (ONO) dielectric layer using an in-situ process. An ONO layer, by using in-situ plasma generated nitration, may be fabricated without creation of interface states resulting from weak bonding and contamination. The embodiments may be carried out in a single reactor and under like temperature conditions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a dielectric layer, the method comprising:
   sequentially forming a first oxide layer, a nitride layer, and a second oxide layer on a substrate by performing a plasma-enhanced atomic layer deposition process, wherein a first nitrogen plasma treatment is performed after forming the first oxide layer such that at least some hydroxide groups on a surface of the first oxide layer are replaced with amino groups; and
   performing a second nitrogen plasma treatment on a surface of the nitride layer, after forming the nitride layer, wherein performing the second nitrogen plasma treatment on a surface of the nitride layer includes removing hydrogen atoms contained in amino groups on the surface of the nitride layer.

2. The method as claimed in claim 1, wherein forming the first oxide layer, the nitride layer, and the second oxide layer and performing the first nitrogen plasma treatment are performed using an in-situ process.

3. The method as claimed in claim 2, wherein during forming the first oxide layer, the nitride layer, and the second oxide layer and performing the first nitrogen plasma treatment, the substrate is placed on a susceptor in a chamber and the susceptor is maintained at a constant temperature.

4. The method as claimed in claim 1, wherein performing the first nitrogen plasma treatment includes performing a nitrogen plasma treatment on the surface of the first oxide layer using a gas containing nitrogen and helium.

5. The method as claimed in claim 1, wherein:
   forming the first and second oxide layers includes supplying first and second silicon precursors and oxidizing the first and second silicon precursors, respectively, by performing an oxygen plasma treatment, and
   forming the nitride layer includes supplying a third silicon precursor and nitridating the third silicon precursor by performing a third nitrogen plasma treatment.

6. The method as claimed in claim 5, wherein the first to third silicon precursors are the same and the first to third silicon precursors have Si—N bonds.

7. The method as claimed in claim 5, wherein a first power applied to the chamber during the first nitrogen plasma treatment is larger than a second power applied to the chamber during the oxygen plasma treatments and the third nitrogen plasma treatment.

8. The method as claimed in claim 5, wherein performing the third nitrogen plasma treatment includes nitridating the third silicon precursor using a gas containing nitrogen and hydrogen.

9. A method of forming a dielectric layer, the method comprising:

placing a substrate on a susceptor in a chamber;

sequentially forming a first oxide layer, a nitride layer, and a second oxide layer on the substrate using an in-situ process, wherein the susceptor is maintained at a constant temperature during forming the first oxide layer, the nitride layer, and the second oxide layer;

performing a first nitrogen plasma treatment on a surface of the first oxide layer, after forming the first oxide layer, such that at least some hydroxide groups on the surface of the first oxide layer are replaced with amino groups; and performing a second nitrogen plasma treatment on a surface of the nitride layer, after forming the nitride layer, wherein performing the second nitrogen plasma treatment on a surface of the nitride layer includes removing hydrogen atoms contained in amino groups on the surface of the nitride layer.

10. The method as claimed in claim 9, wherein:

forming the first oxide layer, the nitride layer, and the second oxide layer includes performing a plasma enhanced atomic layer deposition process, and a first power applied to the chamber during the first nitrogen plasma treatment and the second nitrogen plasma treatment is larger than a second power applied to the chamber to form the first oxide layer, the nitride layer, and the second oxide layer.

11. The method as claimed in claim 9, wherein:

forming the first and second oxide layers includes supplying first and second silicon precursors and oxidizing the first and second silicon precursors, respectively, by performing oxygen plasma treatments, and forming the nitride layer includes supplying a third silicon precursor and nitridating the third silicon precursor by performing a third nitrogen plasma treatment.

12. The method as claimed in claim 11, wherein the first to third silicon precursors are the same and the first to third silicon precursors have Si—N bonds.

13. A method of forming a dielectric layer using an in-situ process, the method comprising:

forming a first oxide layer on a substrate by performing a plasma-enhanced atomic layer deposition process;

performing a first nitrogen plasma treatment on the first oxide layer such that at least some hydroxide groups on a surface of the first oxide layer are replaced with amino groups;

forming a nitride layer on the first oxide layer by performing a plasma-enhanced atomic layer deposition process;

forming a second oxide layer on the nitride layer by performing a plasma-enhanced atomic layer deposition process; and performing a second nitrogen plasma treatment on a surface of the nitride layer, after forming the nitride layer, wherein performing the second nitrogen plasma treatment on a surface of the nitride layer includes removing hydrogen atoms contained in amino groups on the surface of the nitride layer.

14. The method as claimed in claim 13, wherein performing the first nitrogen plasma treatment includes performing a nitrogen plasma treatment on the surface of the first oxide layer using a gas containing nitrogen and helium.

15. The method as claimed in claim 13, wherein:

forming the first oxide layer includes supplying a silicon precursor and oxidizing the silicon precursor by performing an oxygen plasma treatment, forming the nitride layer includes supplying the silicon precursor and nitridating the precursor by performing a third nitrogen plasma treatment, and forming the second oxide layer includes supplying the silicon precursor and oxidizing the silicon precursor by performing an oxygen plasma treatment.

16. The method as claimed in claim 15, wherein performing the third nitrogen plasma treatment includes nitridating the precursor using a gas containing nitrogen and hydrogen.

* * * * *